United States Patent [19]
Briggs et al.

[11] 3,961,228
[45] June 1, 1976

[54] PRINTED CIRCUIT BOARD ARRANGEMENT

[75] Inventors: Glenn E. Briggs; Edmund E. Beach, both of Fort Lauderdale; Walter P. Chase, Sunrise, all of Fla.

[73] Assignee: Motorola, Inc., Chicago, Ill.

[22] Filed: Mar. 28, 1975

[21] Appl. No.: 563,417

[52] U.S. Cl. .......................... 317/101 R; 317/101 F
[51] Int. Cl.² .......................................... H05F 1/04
[58] Field of Search................. 317/101 F, 101 DH; 174/685; 339/176 MF, 17 F

[56] References Cited
UNITED STATES PATENTS
3,597,660  8/1971  Jensen et al. .................... 317/101 C

*Primary Examiner*—David Smith, Jr.
*Attorney, Agent, or Firm*—Donald B. Southard; James W. Gillman

[57] ABSTRACT

An improved printed circuit board arrangement is disclosed which is especially suited for use in miniaturized electrical or electronic apparatus. A first printed circuit board is provided for accommodating a plurality of circuit components and designed to accomplish predetermined operational capabilities. Additional operating features may be readily and conveniently provided by separate option circuit boards which may be selectively interconnected to the first or main chassis board. The interconnection is effected by a pair of guide rails which engage respective edge portions along the sides of the two circuit boards and maintain the same in an edge-to-edge, coplanar relation. The boards may be permanently secured together by any suitable soldering process. Electrical interconnection is accomplished by a ribbon flex harness with printed conductors and connection terminals at respective ends which engage suitable connection terminals on the associated circuit boards.

6 Claims, 4 Drawing Figures

PRINTED CIRCUIT BOARD ARRANGEMENT

BACKGROUND OF THE INVENTION

The present invention relates in general to printed circuitry and more particularly to an improved printed circuit board arrangement especially suited for use in miniaturized electronic apparatus wherein a main or master circuit board and associated components may be used to provide predetermined operational capabilities with other operating features being provided by separate option circuit boards selectively interconnectable with the main chassis board.

Printed circuitry of one sort or another has been incorporated in a wide variety of electrical and electronic devices. It is particularly advantageous however for use with miniaturized electronic apparatus where space is critical and bulky wire-to-wire connections cannot be easily tolerated.

Portable, hand-held, two-way communications provides a particular advantageous application for printed circuitry and their attendant associated printed circuit boards. A single basic or master circuit board can be designed to retain the various required electronic components for the transmitter and receiver portions thereof, and planned or laid out as to effect the various intercircuit connections to make the apparatus as a whole functional, all with minimum space and optimized efficiency. One disadvantage, however, is that the printed circuit chassis board, once designed and laid out, is thereby fixed operationally, and not readily adaptable to meet any additional or alternative operational features.

For example, in the portable two-way communications unit above-referenced, if tone coded squelch operation is required, or if automatic unit identification is to be effected upon interrogation from some centralized location, then it would be expected that an entirely different chassis board would need to be designed so as to implement the desired function in addition to the conventional transmit and receive operation. It will be readily appreciated that this creates an added inventory burden, i.e., a different circuit board for each combination of operational capabilities, increases costs unnecessarily, is inefficient, inflexible, and may well impair reliability.

SUMMARY OF THE INVENTION

Accordingly, it is an object of the present invention to provide an improved printed circuit board arrangement for use in miniaturized electrical or electronic apparatus which overcomes the foregoing deficiencies.

A more particular object of the present invention is to provide an improved printed circuit board arrangement especially adapted for use in portable, hand-held communications devices wherein a main or master printed circuit board, together with associated components, provide the predetermined operational capability and wherein optional accessory circuit boards may be interconnected therewith to provide additional operational functions without modification to the main chassis board.

Another object of the present invention is to provide an improved printed circuit board arrangement wherein additional option or accessory circuit boards may be physically attached to a main or master circuit board by guide rails engaging respective edge portions thereof with a predesigned printed circuit flex harness providing the necessary electrical interconnections between the circuit boards.

In practicing the invention, a printed circuit board arrangement is provided for use with miniaturized electrical or electronic apparatus, say, for example, portable, hand-held, two-way communications equipment. A rigid main or master printed circuit board is designed to accommodate the various transmitting and receiving components thereon, as well as serving to make the necessary electrical connections therebetween. The radio unit is designed to provide a predetermined operational capability.

Where additional operational features may be desired or required, the same may be provided by additional option circuit boards that are attached to and interconnected with the main or master circuit board. The physical attachment is effected by a pair of guide rails which engage respective edge portions of the sides of both the master and added option board and serves to support them in a co-planar, edge-to-edge relation. At the same time, a predesigned printed circuit flex harness may be utilized to make all of the necessary electrical interconnections between the master board and the added option board. The flex harness is preferably in a flat ribbon or strip configuration and which may, for example, include metalized fingers which are insertable within plated-through holes in the referenced circuit boards.

When the board assembly is subjected to a flow or wave solder process, the flex harness is thereby permanently interconnected between the circuit boards. In addition, the guide rails are likewise permanently soldered to the ground plating of the boards and provide still greater and more secure support for the interconnected circuit boards.

BRIEF DESCRIPTION OF THE DRAWINGS

The features of the present invention which are believed to be novel are set forth with particularity in the appended claims. The invention itself, however, with further objects and advantages thereof may be best understood with reference to the following description when taken in conjunction with the accompanying drawings, in which:

DESCRIPTION OF THE PREFERRED EMBODIMENT

Figure 1:
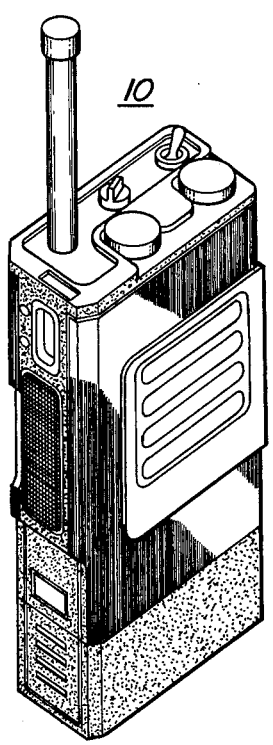
FIG. 1 is a front elevational view in perspective of a portable, hand-held, two-way communications device in which the present invention may be advantageously utilized.
Figure 2:
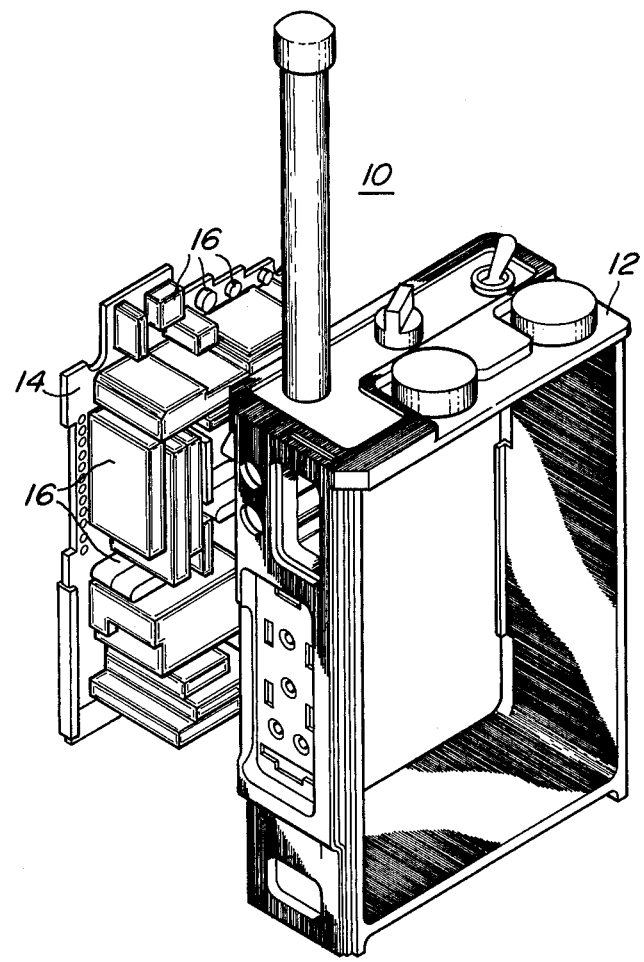
FIG. 2 is a partial exploded view in perspective of the housing and printed circuit chassis board forming a part of the radio unit shown in FIG. 1.

Referring now to the drawings, a portable, hand-held two-way communication unit 10 is shown in FIG. 1, which radio device may be considered as typical of the miniature electrical or electronic apparatus that may advantageously utilize the present invention. As indicated in FIG. 2, the radio unit 10 may include a unitized, high impact, plastic molded housing 12 with open front and back faces. Housing 12 is adapted to receive a printed circuit board 14 in the manner indicated on which a plurality of associated electronic components 16 are mounted. These components, along with other elements not shown, provide the transmit and receive capability for the radio unit 10 as a whole, the operation of which may be considered as entirely conventional and therefore known to those skilled in the art such that further and more detailed description of its operational characteristics is unnecessary.

Figure 3:
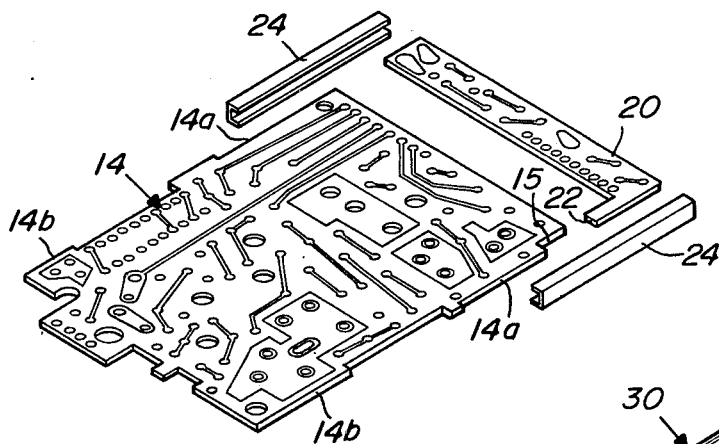
FIG. 3 is a top planar view in perspective of the printed circuit board shown in FIG. 2, without associated components, to which an option board may be interconnected therewith, in accordance with the present invention.
Figure 4:
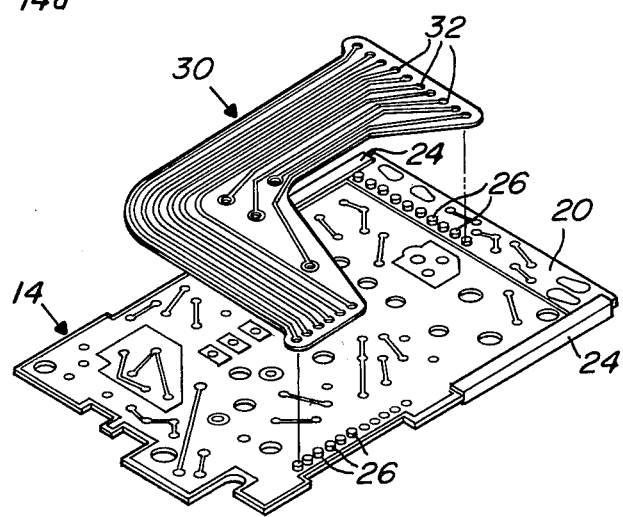
FIG. 4 is a bottom planar view in perspective of the two circuit boards shown in FIG. 3, suitably interconnected by guide rails and to which a printed flex harness may be utilized to effect the necessary electrical interconnections therebetween.

Printed circuit board 14, as shown in FIGS. 3 and 4 without the associated electronic components mounted thereon, is preferably formed of a rigid base on which printed circuitry or plated conductors of copper material or the like is included in top and bottom surfaces thereof in a configuration to provide the necessary interconnections between the circuit components 16 of FIG. 2.

As mentioned previously, circuit board 14, serving as the single master chassis board, together with components 16, comprise radio apparatus 10 and is designed to provide certain predetermined operational capabilities. In the past, should any additional operational features be desired for such radio apparatus, a completely redesigned chassis circuit board was required to accommodate the additional circuit components required and the necessary circuit interconnections therebetween. In accordance with the present invention, this is no longer the case.

Additional circuit functions may be provided by separate option circuit boards, such as that indicated generally at 20. In the interest of clarity, the associated components to be included in circuit board 20 are not depicted since they form no part of the present invention. Circuit board 20 abuts circuit board 14 in an edge-to-edge, co-planar configuration. A projection or tab 22 at one corner of circuit board 20 keys into a complementary notch 15 provided in circuit board 14. A pair of U-shaped guide rails 24 are dimensioned to engage a portion of the edges along respective sides thereof with sufficient friction fit so as to support and maintain the circuit boards 14 and 20 in their assembled, co-planar relation, best seen in FIG. 4. Circuit boards 14 and 20, and guide rails 24, may be permanently secured together when the assembly is subjected to a suitable flow or wave solder process customarily employed with printed circuit apparatus of this type.

Where physical dimensions are critical and it is essential that they be kept substantially the same, widthwise, the forward portion 14a of circuit board 14 engaged by guide rails 24 may be reduced or cut back so that in the assembled relation, the back surface of guide rails 24 coincides, and makes a flush fit with, the widest dimension of board 14, such as that identified at 14b in FIGS. 3 and 4.

While guide rails 24 effect the necessary physical attachment of the added option board 20 to the master chassis board 14, they do not of course provide the necessary electrical interconnections therebetween. The latter may be conveniently accomplished by a predesigned printed flex harness, indicated generally at 30 in FIG. 4. Flex harness 30 preferably includes suitable printed conductors on a thin flexible base formed of a plastic insulating material or the like. In the configuration shown, harness 30 is in the form of a flat ribbon or strip with plated-through openings 32 at respective ends thereof to serve as terminal connections. These terminals are intended to insert over appropriate upstanding fingers or connection pins 26 included at appropriate locations on the respective circuit boards 14 and 20. The entire assembly may then be subjected to a flow or wave solder process to effect permanent connection. It should be understood that the interconnection components can be reversed where and if desired. That is, flex harness 30 can include the terminal pins identified at 26 which would then insert into plated-through apertures or openings in boards 14 and 20.

Accordingly, an improved printed circuit board arrangement has been set forth and described herein for use with miniaturized electrical or electronic apparatus which effectively provides for a more flexible, efficient, and reliable product. There are less components to stock, thereby reducing inventory requirements, and a significantly greater flexibility is provided for building block products of this type.

While only a particular embodiment of the present invention has been shown and described, it will be obvious to those skilled in the art that various changes and modifications may be made without departing from the invention in its broader aspects. Accordingly, the aim in the appended claims is to cover all such changes and modifications that may fall within the true spirit and scope of the present invention.

What is claimed is:
1. An improved printed circuit board arrangement for electrical apparatus, comprising in combination:
   a first printed circuit board for accommodating a plurality of associated components and designed to provide predetermined operational capabilities;
   a second printed circuit board for accommodating other circuit components and designed to provide additional operational capabilities,
   said first and second printed circuit boards being placed in an edge-to-edge, co-planar relation with one another;
   a pair of guide rails for bridging said first and second circuit boards and engaging respective edge portions thereof to maintain the same in said co-planar relation; and
   a printed flex harness interconnecting said first and second printed circuit board.

2. An improved printed circuit board arrangement in accordance with claim 1 wherein said first circuit board includes a reduced forward portion dimensioned to receive said guide rails and provide a flush fit between the back surface of said guide rails and the remaining edge of said first circuit board.

3. An improved circuit board arrangement in accordance with claim 1 wherein said guide rails are of a substantially U-shaped configuration and dimensioned to make a friction fit with said end portions of said first and second circuit boards.

4. An improved printed circuit board arrangement in accordance with claim 1 wherein said first circuit board includes a notched out corner into which a projection included on said second circuit board inserts therein and effect a keying action therewith.

5. An improved printed circuit board arrangement in accordance with claim 1 wherein said flex harness is in the form of a flat ribbon strip having a plurality of printed conductors on a flexible base of plastic insulating material.

6. An improved printed circuit board arrangement in accordance with claim 1 wherein said flex harness includes connection terminals at respective ends thereof and wherein said first and second circuit boards include corresponding terminal means for engaging said connection terminals of said flex harness.

* * * * *